(12) United States Patent
Watabe et al.

(10) Patent No.: US 11,038,078 B2
(45) Date of Patent: Jun. 15, 2021

(54) METHOD FOR MANUFACTURING HIGH EFFICIENCY SOLAR CELL

(71) Applicant: SHIN-ETSU CHEMICAL CO., LTD., Tokyo (JP)

(72) Inventors: Takenori Watabe, Annaka (JP); Hiroshi Hashigami, Annaka (JP); Hiroyuki Ohtsuka, Karuizawa-machi (JP)

(73) Assignee: SHIN-ETSU CHEMICAL CO., LTD., Tokyo (JP)

(*) Notice: Subject to any disclaimer, the term of this patent is extended or adjusted under 35 U.S.C. 154(b) by 10 days.

(21) Appl. No.: 16/621,743

(22) PCT Filed: Apr. 20, 2018

(86) PCT No.: PCT/JP2018/016233
§ 371 (c)(1),
(2) Date: Dec. 12, 2019

(87) PCT Pub. No.: WO2018/235422
PCT Pub. Date: Dec. 27, 2018

(65) Prior Publication Data
US 2020/0105963 A1    Apr. 2, 2020

(30) Foreign Application Priority Data

Jun. 23, 2017   (JP) .............................. JP2017-122764

(51) Int. Cl.
*H01L 31/18* (2006.01)
*H01L 31/0216* (2014.01)
(52) U.S. Cl.
CPC .... *H01L 31/1868* (2013.01); *H01L 31/02167* (2013.01)

(58) Field of Classification Search
CPC ........... H01L 31/1868; H01L 31/02167; H01L 31/068; Y02P 70/50; Y02E 10/547
See application file for complete search history.

(56) References Cited

U.S. PATENT DOCUMENTS

| 10,692,736 B2* | 6/2020 | Hashigami ............ H01L 31/068 |
| 2013/0052774 A1 | 2/2013 | Kurobe |

(Continued)

FOREIGN PATENT DOCUMENTS

| JP | 2003-101045 A | 4/2003 |
| JP | 2014-175660 A | 9/2014 |
| JP | 2016-167524 A | 9/2016 |

OTHER PUBLICATIONS

L. E. Black and K. R. McIntosh, Surface Passivation of c-Si by Atmospheric Pressure Chemical Vapor Deposition of Al2O3, Appl. Phys. Lett. 100, 202107 (2012) (Year: 2012).*

(Continued)

*Primary Examiner* — Earl N Taylor
(74) *Attorney, Agent, or Firm* — Oliff PLC

(57) ABSTRACT

A method for manufacturing a solar cell capable of enhancing photoelectric conversion efficiency is provided. The present invention is a method for manufacturing a solar cell which includes steps of forming a p-n junction on a silicon semiconductor substrate and forming an aluminum oxide film on at least one main surface of the silicon semiconductor substrate, including: a step of subjecting the silicon semiconductor substrate to heat treatment in an atmosphere with 20 g or more water vapor per cubic meter and a temperature of 60° C. or more and 100° C. or less before the step of forming the aluminum oxide film. Consequently, a method for manufacturing a solar cell capable of enhancing photoelectric conversion efficiency is provided.

4 Claims, 3 Drawing Sheets

(56) References Cited

U.S. PATENT DOCUMENTS

| | | | |
|---|---|---|---|
| 2013/0157409 A1 | 6/2013 | Vaidya et al. | |
| 2014/0251424 A1* | 9/2014 | Yang et al. | |
| 2018/0342402 A1* | 11/2018 | Hashigami | H01L 31/1804 |
| 2020/0105963 A1* | 4/2020 | Watabe | H01L 31/1868 |

OTHER PUBLICATIONS

May 22, 2018 Search Report issued in International Patent Application No. PCT/JP2018/016233.

Shigeno, Satoshi et al., "Passivation of Silicon Surfaces by Oxygen Radical followed by High Pressure H2O Vapor Heat Treatments and Its Application to Solar Cell Fabrication", Active-Matrix Flatpanel Displays and Devices, 2014, 21st International Workshop, pp. 229-232.

Motoki, Takayuki et al., "Surface Passivation of Crystalline Silicon by Heat Treatment in Liquid Water", Active-Matrix Flatpanel Displays and Devices, 2016, The 23rd International Workshop, pp. 286-289.

Dec. 17, 2020 Extended Search Report issued in European Patent Application No. 18821539.6.

\* cited by examiner

[FIG. 1]
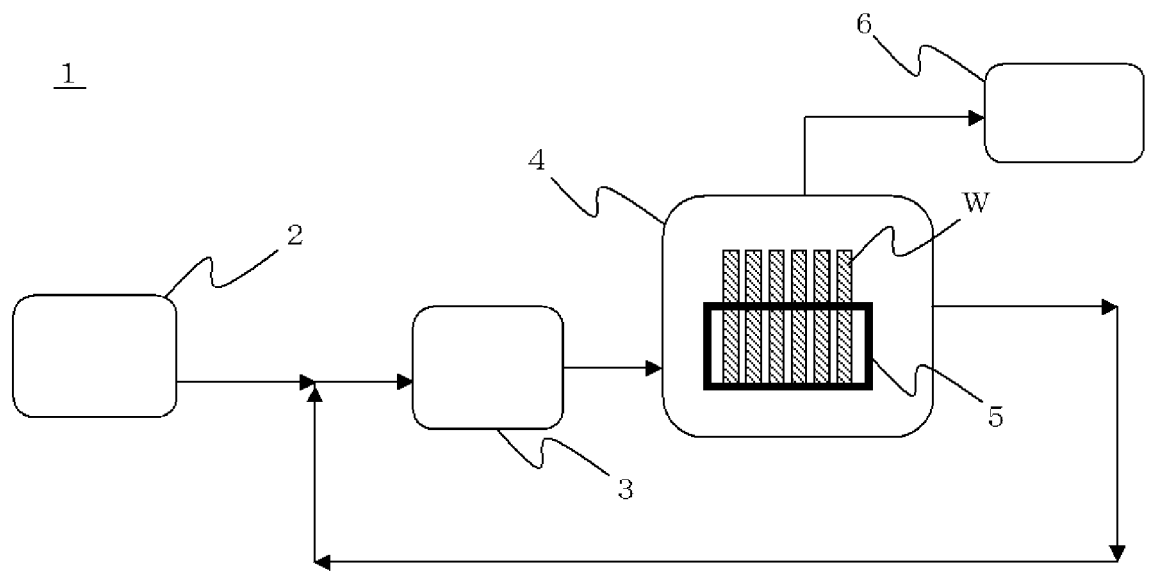
[FIG. 2]
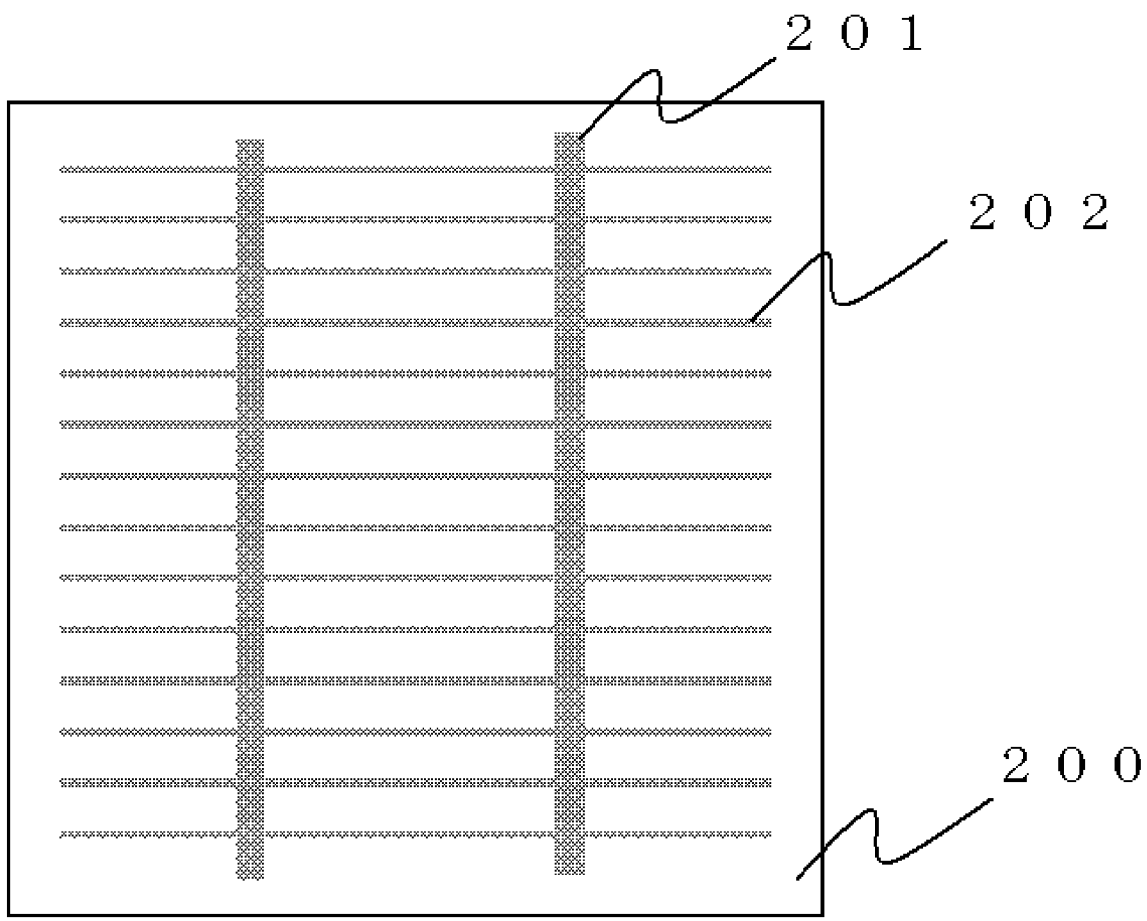

[FIG. 3]
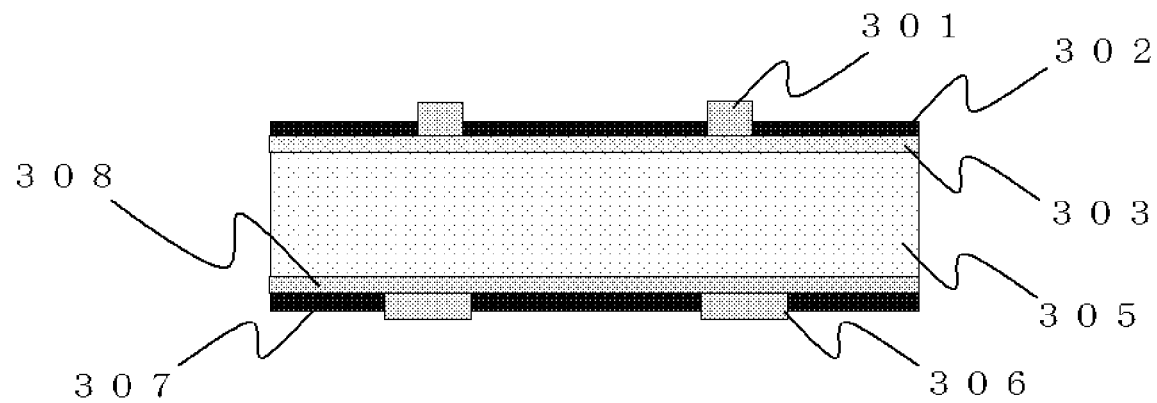
[FIG. 4]
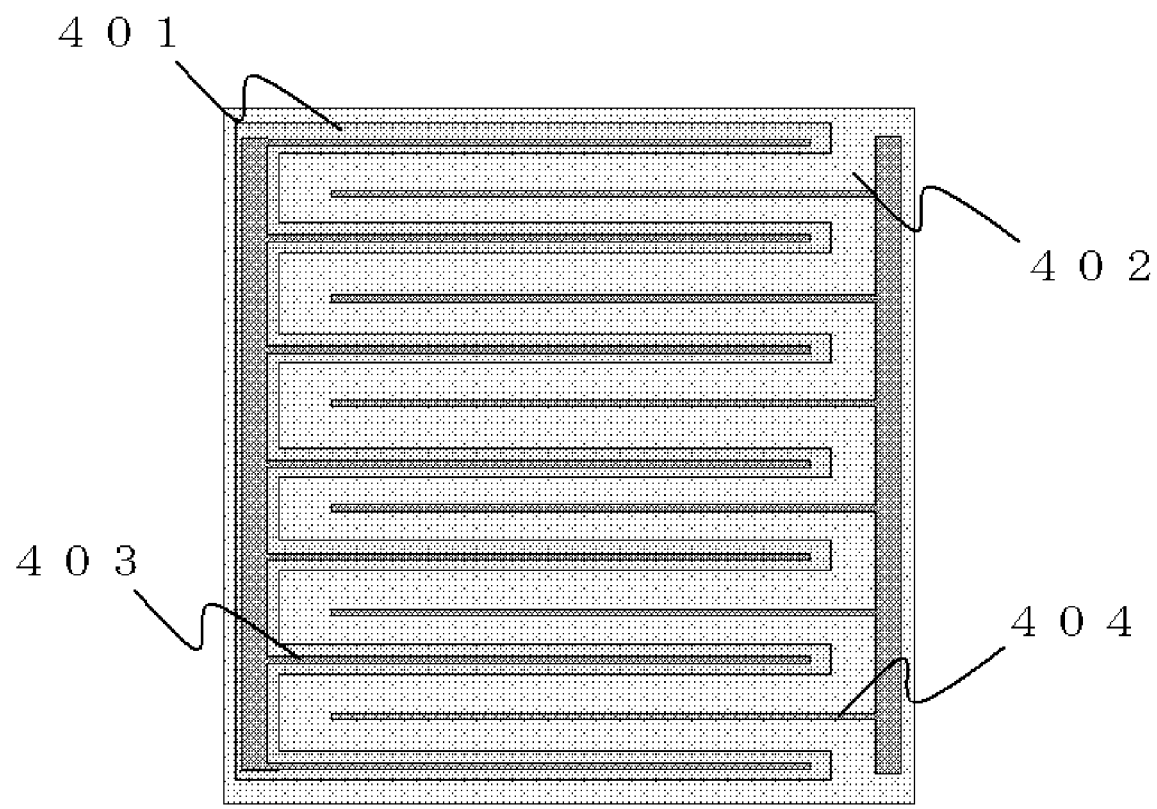

[FIG. 5]
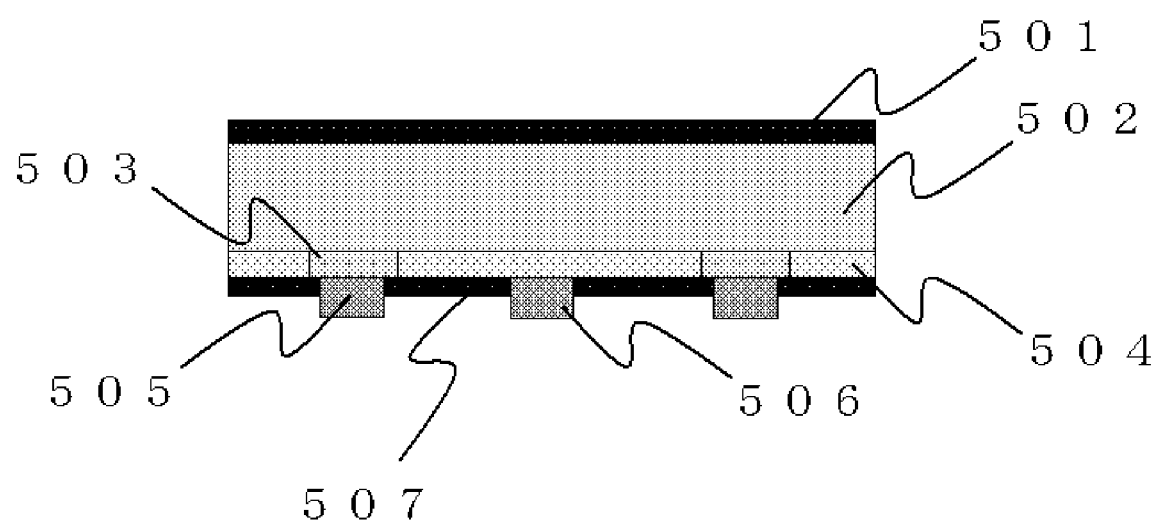

METHOD FOR MANUFACTURING HIGH EFFICIENCY SOLAR CELL

TECHNICAL FIELD

The present invention relates to: a method for manufacturing a high efficiency solar cell.

BACKGROUND ART

FIG. 2 shows an overview of a high photoelectric conversion efficiency solar cell which uses a single-crystal N-type silicon substrate, and FIG. 3 shows a schematic view of a cross-sectional structure of the same. As in FIGS. 2 and 3, a high photoelectric conversion efficiency solar cell has many electrodes that have a width of 100 to tens of pm called finger electrodes 202 and 301 as collecting electrodes on a light receiving surface 200. An interval between adjacent finger electrodes is generally approximately 1 to 3 mm. Further, as in FIG. 2, two to four bus bar electrodes 201 are provided as collecting electrodes to couple the solar cells. As methods for forming these electrodes, there are a vapor deposition method, a sputtering method, etc., but a method of printing a metal paste which has fine metal particles of Ag, etc. mixed in an organic binder by the use of a screen plate, etc. and performing a heat treatment at hundreds of degrees to bond the metal paste to a substrate is extensively used considering cost. As shown in FIG. 3, portions other than the electrodes are covered with an antireflection film 302 which is a silicon nitride film, etc. A P-type layer 303 which is opposite to a conductivity type of the substrate is formed on a front surface (light receiving surface) of the single-crystal N-type silicon substrate 305. Finger electrodes 306 are also formed on a back surface side, and portions other than the electrodes are covered with a film 307 of silicon nitride, etc. A high-concentration N-type layer 308 which has the same conductivity type as that of the substrate is formed on the outermost surface layer on the back surface.

Further, as a solar cell structure which has high photoelectric conversion efficiency, there is a back contact solar cell. FIG. 4 shows an overview of a back surface of this back contact solar cell. As in FIG. 4, emitter layers 402 and base layers 401 are alternately aligned, and finger electrodes 403 and 404 are provided along upper sides of the respective layers. An emitter layer width is several mm to hundreds of µm, and a base layer width is hundreds of µm to tens of µm. Furthermore, an electrode width is generally approximately hundreds to tens of µm. FIG. 5 shows a schematic view of a cross-sectional structure of a part of the back contact solar cell. The emitter layers 504 and the base layers 503 are formed in the vicinity of the outermost surface layer on the back surface of the substrate 502. Each layer thickness is no more than approximately 1 µm. The finger electrodes 505 and 506 are provided on the respective layers, and a surface of a non-electrode region is covered with a silicon nitride film or a silicon oxide film, etc. 507. For the purpose of reducing a reflection loss, an antireflection film 501 is provided on the light receiving surface side. Since no electrode is present on the light receiving surface of a back contact solar cell, an incident light enters the substrate without being blocked, and hence photoelectric conversion efficiency is higher compared to a structure with electrodes provided on a light receiving surface as in FIG. 3.

CITATION LIST

Patent Literature

Patent Document 1: Japanese Unexamined Patent Application Publication No. 2014-175660

SUMMARY OF INVENTION

Technical Problem

As a protective film of a substrate surface (a light receiving surface and a back surface, which is a non-light receiving surface), silicon oxide and silicon nitride as described above are typical, but in recent years, aluminum oxide has come to be used. Aluminum oxide as a passivation film is, for example, disclosed in Patent Document 1. These passivation films suppress recombination of electrons and holes on the surface by being chemically joined to the silicon substrate surface, and further have the function of enhancing photoelectric conversion efficiency. Therefore, condition of the substrate surface before these films are formed is important for the enhancement of photoelectric conversion efficiency.

The present invention has been made in view of the above-described problem, and an object thereof is to provide a method for manufacturing a solar cell capable of enhancing photoelectric conversion efficiency.

Solution to Problem

To achieve the object, the present invention provides a method for manufacturing a solar cell which includes steps of forming a p-n junction on a silicon semiconductor substrate and forming an aluminum oxide film on at least one main surface of the silicon semiconductor substrate, comprising: a step of subjecting the silicon semiconductor substrate to heat treatment in an atmosphere with 20 g or more water vapor per cubic meter and a temperature of 60° C. or more and 100° C. or less before the step of forming the aluminum oxide film.

As described, by heating the silicon semiconductor substrate and then forming the aluminum oxide film with the humidity around the silicon semiconductor substrate slightly raised, recombination of carriers on the surface of the silicon semiconductor substrate is suppressed and photoelectric conversion efficiency is enhanced. This can be considered to be because water molecules are adsorbed on the surface of the silicon semiconductor substrate and an aluminum oxide film is formed thereon, thereby raising surface passivation effect.

At this time, the atmosphere in the step of subjecting the silicon semiconductor substrate to heat treatment preferably comprises air.

When air is used in the atmosphere for heat treatment, supplying and exhausting air are easy, and heat treatment can be performed safely at low costs.

Further, the inventive method for manufacturing a solar cell preferably comprises a step of cleaning the silicon semiconductor substrate before the step of forming the aluminum oxide film, wherein the step of subjecting the silicon semiconductor substrate to heat treatment is performed at the same time as a drying step after the step of cleaning the silicon semiconductor substrate.

Since a cleaning step is usually performed before forming the aluminum oxide film, a heat treatment as described above can be performed in the drying step after this cleaning step, and in this way, photoelectric conversion efficiency can be enhanced without increasing the number of steps.

ADVANTAGEOUS EFFECTS OF INVENTION

According to the inventive method for manufacturing a solar cell, surface passivation effect of an aluminum oxide film can be enhanced by a simple method, and photoelectric conversion efficiency of the solar cell can be enhanced. Further, when the heat treatment step also serves as the drying step, the number of steps is not increased, and since gas for drying can also be circulated, the amount of used gas and the amount of heating can be reduced, and it is economical.

BRIEF DESCRIPTION OF DRAWINGS

FIG. 1 is a conceptual diagram of a heating apparatus in which the pre-treatment before forming the aluminum oxide film in the inventive method for manufacturing a solar cell is performed;

FIG. 2 is an overview diagram of a general both-sided electrode type solar cell;

FIG. 3 is a schematic cross-sectional diagram of a general both-sided electrode type solar cell;

FIG. 4 is a back side overview diagram of a general back contact solar cell;

FIG. 5 is a schematic cross-sectional diagram of a general back contact solar cell.

DESCRIPTION OF EMBODIMENTS

Hereinafter, embodiments of the present invention will be described, but the present invention is not limited thereto. In the following detailed description, to understand the entire present invention and explain how the present invention is carried out in a given specific example, many specific details will be described. However, it can be understood that the present invention can be carried out without these specific details. To prevent obscureness of the present invention, a known method, procedures, and techniques will not be described in detail hereinafter. Although given specific examples of the present invention will be described with reference to specific drawings, the present invention is not limited thereto. The drawings included and explained herein are schematic, and do not limit a scope of the present invention. Furthermore, in the drawings, for the purpose of illustration, sizes of some elements are exaggerated, and hence their scales may not be correct.

Here, two types of embodiments of the inventive method for manufacturing a solar cell will be described. As the first embodiment, manufacturing of a both-sided electrode type solar cell, which has electrodes formed on both main surfaces of the solar cell, and as the second embodiment, manufacturing of a back contact solar cell, which has electrodes formed on one main surface of the solar cell will be described. However, the inventive method for manufacturing a solar cell is not limited by these embodiments alone.

First Embodiment

Here, a specific description will be given with a case in which an N-type silicon semiconductor substrate is used as an example. Firstly, high-purity silicon is doped with group 5 elements such as phosphorous, arsenic and antimony to prepare an as-cut single-crystal {100} N-type silicon substrate which has a specific resistance of 0.1 to 5 Ω·cm as a silicon semiconductor substrate. The single-crystal silicon substrate may be fabricated by any one of a CZ method (Czochralski method) and an FZ method (Floating zone method). The silicon semiconductor substrate does not necessarily have to be a single-crystal silicon, and it may be a polycrystalline silicon.

Next, mechanical damage formed on the surface of the silicon semiconductor substrate at the time of slicing and grinding can be removed by etching using a high-concentration alkali such as sodium hydroxide or potassium hydroxide with a concentration of 5 to 60% or a mixed acid of a hydrofluoric acid and a nitric acid, etc. Depending on conditions for texture formation in a subsequent step, this step is not necessarily required, and can be omitted.

Subsequently, small irregularities called a texture can be formed on the surface of the silicon semiconductor substrate. The texture has a small pyramid-shaped structure, and is formed using the fact that etching speed varies depending on crystal plane orientation. The texture is formed by immersion in a heated alkali solution (concentration: 1 to 10%, temperature: 60 to 90° C.) such as sodium hydroxide, potassium hydroxide, potassium carbonate, sodium carbonate, or sodium hydrogencarbonate for approximately 10 minutes to 30 minutes. A certain amount of 2-propanol may be dissolved in the above solution to promote a reaction.

After forming the texture, cleaning is performed in an acid aqueous solution of a hydrochloric acid, a sulfuric acid, a nitric acid, a hydrofluoric acid, etc. or a mixture thereof. A hydrogen peroxide can be mixed to improve cleanliness.

Next, a step of forming a p-n junction on a silicon semiconductor substrate is performed. For formation of a P-type layer, a vapor phase diffusion method or a coating diffusion method can be used, and either method can be used. As an example of the vapor phase diffusion method, it is possible to adopt a method of stacking two silicon semiconductor substrates as a pair, putting them in a heat treatment furnace in this state, introducing a mixed gas of $BBr_3$ and oxygen, and performing a heat treatment at 950 to 1050° C. As a carrier gas, nitrogen or argon is preferable. In addition, as an example of the coating diffusion method, it is possible to adopt a method of applying a coating agent containing a boron source to an entire first main surface (a surface that becomes a light receiving surface when made into a solar cell) and performing a heat treatment at 950 to 1050° C. As the coating agent, it is possible to use, for example, an aqueous solution containing 1 to 4% of boric acid as the boron source and 0.1 to 4% of polyvinyl alcohol as a thickener.

Next, an N-type layer is formed on a second main surface (a surface opposite to the surface with the P-type layer formed, and that becomes a non-light receiving surface when made into a solar cell). For formation of an N-type layer, a vapor phase diffusion method or a coating diffusion method can be used, and either method can be used. As an example of the vapor phase diffusion method, it is possible to adopt a method of stacking two silicon semiconductor substrates as a pair, putting them in a heat treatment furnace in this state, and performing a heat treatment on the substrate at 830 to 950° C. in a mixed gas atmosphere of phosphorous oxychloride, nitrogen, and oxygen. The coating diffusion method is a method of spin-coating or printing a material containing phosphorous, and then carrying out a heat treatment, and any method can be used.

After the diffusion heat treatment is finished, glass on the surface can be removed with hydrofluoric acid, etc., and the substrate can be cleaned with pure water, etc.

Next, in the inventive method for manufacturing a solar cell, as a pre-treatment of aluminum oxide film formation, a step of subjecting the silicon semiconductor substrate to heat treatment in an atmosphere with 20 g or more water vapor per cubic meter and a temperature of 60° C. or more and 100° C. or less is performed before the step of forming the aluminum oxide film. Regarding the amount of water vapor per cubic meter, the amount of water vapor that corresponds to saturated vapor pressure which depends on temperature is the upper limit. Heat treatment duration is not particularly limited, but approximately 1 minute or more and 60 minutes or less is sufficient, and 3 minutes or more and 20 minutes or less is preferable.

In addition, as the atmosphere, inert gas may be used. As inert gas, apart from inert gases such as nitrogen and argon, oxygen and air, etc. which are easy to exhaust or any of these may be used. In particular, the atmosphere in the step of subjecting the silicon semiconductor substrate to heat treatment preferably includes air. When air is used in the atmosphere for heat treatment, supplying and exhausting air are easy, and heat treatment can be performed safely at low costs.

As the easiest heating method that fulfils the amount of water vapor per cubic meter and the heating temperature defined in the present invention described above, there is a method of putting the substrate on an open heating device such as a hot plate. For example, the amount of water vapor per cubic meter of air that is 25° C. and has a relative humidity of 50% is about 11.5 g, and therefore, the amount of water vapor per cubic meter can be controlled to be in the above range simply by supplying water to the heating device.

By setting the amount of water vapor and the temperature range as in the present invention, reaction between the silicon on the surface of the silicon semiconductor substrate and water progresses, albeit slightly, and termination of silicon dangling bonds is performed effectively by the subsequent aluminum oxide film formation. In this way, a high-quality surface passivation effect is obtained, recombination at the surface is suppressed, and further, the photoelectric conversion efficiency of the solar cell is enhanced.

If the amount of water vapor per cubic meter is less than 20 g, partial pressure of the water is too low for the reaction with the silicon to progress, and a conversion efficiency enhancement effect cannot be obtained. In addition, if the temperature is less than 60° C., the inventive effect cannot be obtained. If the temperature exceeds 100° C., desorption of the adsorbed water molecules progresses, and if the inert gas includes oxygen, oxidation of the substrate surface progresses, and it is not desirable. Therefore, it is necessary for the temperature to be 100° C. or less.

Further, the step of subjecting the silicon semiconductor substrate to heat treatment may be performed at the same time as a drying step after the step of cleaning the silicon semiconductor substrate. The cleaning step referred to here is the pure-water cleaning after the removal of the glass on the surface of the silicon semiconductor substrate after the diffusion heat treatment is finished.

A conceptual diagram of an example of a heating apparatus that can be used when the drying step and the heat treatment step are performed at the same time is shown in FIG. 1. In the heating apparatus 1, gas taken in from a gas supply unit 2 is heated in a heating unit 3 and supplied to a drying unit 4. A holder 5 which holds a silicon semiconductor substrate W is housed in the drying unit 4, and since water adhered to the silicon semiconductor substrate W and the holder 5 in the above-described cleaning step is brought into the drying unit 4, the amount of water vapor in the atmosphere inside the drying unit can be increased simply by heat-drying the silicon semiconductor substrate W. Part of the gas supplied to the drying unit 4 is discharged through an exhaust port into an exhaust unit 6, and the rest of the gas is circulated. By reducing the amount of gas discharged and increasing the amount circulated, the amount of water vapor per cubic meter can be adjusted to the range of 20 g or more. Incidentally, the amount discharged may be 0 depending on the size of the drying unit 4 and the amount of water brought in. In addition, the relative humidity inside the drying chamber is preferably 90% or less. With a humidity of 90% or less, drying capacity can be maintained, and thus, increase in drying duration can be suppressed.

After such a pre-treatment, a step of forming an aluminum oxide film on at least one main surface of the silicon semiconductor substrate is performed. The aluminum oxide formed on the main surface of the silicon semiconductor substrate may have a thickness of approximately 1 nm to 20 nm. Aluminum oxide film has a particularly large photoelectric conversion efficiency improving effect on the P-type layer, but can be formed on both surfaces. That is, the surface on which the aluminum oxide film is formed can be the first main surface (the surface that becomes a light receiving surface when made into a solar cell) and/or the second main surface (the surface that becomes a non-light receiving surface when made into a solar cell). For the formation of the aluminum oxide film, a CVD (Chemical Vapor Deposition) method or an ALD (Atomic Layer Deposition) method can be used. As reaction gas, trimethylaluminum etc. is used as an aluminum source, and water, nitrous oxide, oxygen, ozone, etc. is used as an oxidation source.

Subsequently, an antireflection film can be formed on the first main surface. As an antireflection film, a silicon nitride film or a silicon oxide film can be used. In the case of a silicon nitride film, using a plasma CVD apparatus, the film is formed so that the sum with the aluminum oxide is about 100 nm. As a reaction gas, monosilane ($SiH_4$) and ammonia ($NH_3$) are often mixed and used, but nitrogen can be used in place of $NH_3$, and further, to adjust a process pressure and dilute the reaction gas, hydrogen is mixed in the reaction gas in some cases. In the case of a silicon oxide film, the CVD method is acceptable, but higher characteristics can be provided from a film obtained by a thermal oxidation method.

In addition, it is also desirable to form a passivation film on the second main surface with silicon nitride film or silicon oxide film, as on the light receiving surface.

Subsequently, as a backside electrode, for example, a paste containing Ag powder is formed by a screen printing method. It is easiest to form a finger electrode and a bus bar electrode at the same time with the printing pattern as a comb-tooth shape. It is preferable for a finger width to be approximately 40 to 200 μm and for a bus bar width to be approximately 0.5 to 2 mm.

The screen printing method is also used for formation of light receiving surface electrodes, and an Ag paste provided by mixing the Ag powder and glass frit with an organic binder is printed. It is easiest to form a finger and a bus bar at the same time with the printing pattern as a comb-tooth shape as with the back surface. It is preferable for a finger width to be approximately 40 to 100 μm and for a bus bar width to be approximately 0.5 to 2 mm.

After the electrode printing on the front and back surfaces, the Ag powder is penetrated through (fire-through) the silicon nitride film by a heat treatment (baking) so that the electrodes can be conducive with silicon. Baking of the electrodes on the back surface and that of the electrodes on the light receiving surface can be performed at a time, or they may be separately performed. The baking is carried out by performing a treatment at a temperature of 700 to 850° C. for several seconds to several minutes.

As described above, the present invention has been described with a case in which an N-type substrate is used as an example, but the inventive method for manufacturing a solar cell can also be used in the case of a P-type substrate.

Second Embodiment

Next, a case in which the inventive method for manufacturing a solar cell is used to manufacture a back contact solar cell will be described. Here, a specific description will be given with a case in which an N-type silicon semiconductor substrate is used as an example. Firstly, an N-type silicon substrate is prepared, and slice damage on a surface is subjected to etching using a high-concentration alkali or a mixed acid of a hydrofluoric acid and a nitric acid, etc. The single-crystal silicon substrate may be one fabricated by any one of the CZ method and the FZ method. The substrate does not necessarily have to be a single-crystal silicon, and it may be a polycrystalline silicon.

Subsequently, a texture can be formed on a substrate surface by the foregoing method.

After forming the texture, cleaning may be performed in an acid aqueous solution of a hydrochloric acid, a sulfuric acid, a nitric acid, a hydrofluoric acid, etc. or a mixture thereof. In addition, a hydrogen peroxide can be mixed to enhance cleanliness.

Next, on a second main surface (a surface that becomes a non-light receiving surface when made into a solar cell) of this silicon semiconductor substrate, an emitter layer is formed. The emitter layer has a conductivity type (a P type in this case) which is opposite to that of the substrate, and may have a thickness of approximately 0.05 to 1 µm. The emitter layer can be formed by the vapor phase diffusion using $BBr_3$, etc. Further, it can also be formed by a method of applying a coating agent containing a boron source to the second main surface and performing a heat treatment.

After forming the emitter layer, a mask for formation of a base layer which is a subsequent step can be formed on both main surfaces. As the mask, a silicon oxide film or a silicon nitride film, etc. can be used. When the CVD method is adopted, appropriately selecting a gas type to be introduced enables formation of any film. In the case of a silicon oxide film, this film can also be formed by thermally oxidizing the substrate. By subjecting the substrate to heat treatment in an oxygen atmosphere at 950 to 1100° C. for 30 minutes to 4 hours, a silicon thermal oxide film of approximately 100 nm is formed. Film thickness can be arbitrarily changed by appropriately selecting a temperature, a duration, a gas, etc., but 30 to 300 nm is preferable to achieve both a mask function and easiness of partial opening in a subsequent step. This heat treatment may be carried out in the same batch following the heat treatment for formation of the emitter layer.

Next, the mask in each part which serves as a base region is partially removed (opened). Specifically, opening is performed to form a parallel line shape so that an opening width becomes 50 to 250 µm and each interval becomes approximately 0.6 to 2.0 mm. To perform the opening, a photolithography method or an etching paste can be adopted, but opening using a laser is easy and preferable. As a laser source, second harmonic waves of a YAG type, a $YVO_4$ type, $GdVO_4$ type, etc. can be used, but any laser source can be used as long as its wavelength is approximately 500 to 700 nm. Although laser conditions can be appropriately decided, it is possible to set, for example, an output of 4 to 20 W, a frequency of 10000 to 100000 Hz, a fluence of 1 to 5 $J/cm^2$, a galvo head, a scan speed of 100 to 5000 mm/second, and others.

After opening the mask, the substrate is immersed in an aqueous solution of alkali such as KOH or NaOH heated to 50 to 90° C. to remove (etch) the unnecessary emitter layer present in the opening portion.

To form the base layer, a vapor phase diffusion method which uses phosphorus oxychloride can be used. Besides the vapor phase diffusion method, the base layer can be likewise formed by a method of performing a heat treatment after spin-coating or printing a material containing phosphorus.

After forming the base layer, the mask and glass formed on the surface can be removed with a hydrofluoric acid, etc. and cleaned with pure water.

Subsequently, as a pre-treatment of aluminum oxide film formation, in the aforementioned method, the substrate is subjected to heat treatment in an atmosphere with 20 g or more water vapor per cubic meter and a temperature of 60 to 100° C. This heat treatment may be the drying step after the above glass removal and cleaning step as described above.

After the above pre-treatment, an aluminum oxide film is formed on the first main surface and/or the second main surface. For forming the film, the CVD (Chemical Vapor Deposition) method or the ALD (Atomic Layer Deposition) method can be used.

Subsequently, an antireflection film can be formed on the first main surface (the surface that becomes a light receiving surface when made into a solar cell). As the antireflection film, a silicon nitride film or a silicon oxide film can be used.

In addition, a surface passivation film can be formed on the second main surface (the surface that becomes a non-light receiving surface when made into a solar cell). As the surface passivation film, a silicon nitride film or a silicon oxide film can be used.

Subsequently, a base electrode is formed by, for example, the screen printing method. For example, a plate which has an opening width of 30 to 200 µm and a parallel line pattern with intervals of 0.6 to 2.0 mm is prepared in advance, and an Ag paste provided by mixing an Ag powder and glass frit with an organic binder is printed along the base layer. Likewise, the Ag paste is printed as an emitter electrode. The Ag paste for the base electrode and the Ag paste for the emitter electrode may be the same, or different pastes may be used. After the electrode printing, the Ag powder is penetrated through (fire-through) the silicon nitride film by a heat treatment so that the electrodes can be conducive with silicon. It is to be noted that the base layer electrode and the emitter layer electrode can be separately baked. Baking is usually achieved by performing a treatment at a temperature of 700 to 850° C. for several seconds to several minutes.

Although an example of the N-type substrate has been described above, in a case where a P-type silicon semiconductor substrate is used, phosphorous, arsenic, antimony, etc. may be diffused in formation of the emitter layer, and boron, Al, etc. may be diffused in formation of the base layer, and the inventive method can also be used in this case.

EXAMPLES

Hereinafter, the present invention will be more specifically described with reference to Examples and Comparative Examples, but the present invention is not limited to these Examples.

In the following Examples, a back contact solar cell was fabricated using the inventive method for manufacturing a solar cell.

Example 1

A damage layer was removed from each phosphorus-doped {100} N-type as-cut silicon substrate each having a thickness of 200 μm and a specific resistance of 1 Ω·cm by a hot concentrated potassium hydroxide aqueous solution, thereafter the substrate was immersed into a potassium hydroxide/2-propanol aqueous solution of 72° C. to form a texture, and then it was cleaned in a hydrochloric acid/hydrogen peroxide mixed solution heated to 75° C.

Subsequently, the two substrates were stacked as a pair and put into a heat treatment furnace in this state, a mixed gas of $BBr_3$, oxygen, and argon was introduced, and a heat treatment was performed at 1000° C. for 10 minutes. As a result of measurement based on a four-point probe method, a sheet resistance was 50Ω. This substrate was thermally oxidized in an oxygen atmosphere at 1000° C. for 3 hours to form a mask.

The mask on the back surface was opened by a laser. As a laser source, a second harmonic wave of $Nd:YVO_4$ was used. An opening pattern was a parallel line shape with intervals of 1.2 mm. An output was 18 W, and a scan speed was 600 mm/second. The substrate was immersed in a KOH of 80° C., and the emitter layer in the opening portion was removed.

Next, in a phosphorus oxychloride atmosphere, the light receiving surfaces were stacked and heat-treated at 870° C. for 40 minutes in this state to form a phosphorus diffusion layer (a base layer) in the opening portion.

Thereafter, this substrate was immersed into a hydrofluoric acid with a concentration of 12% to remove glass on the surface, and was rinsed with pure water and dried.

A hot plate was put in a sealed container, and after putting a petri dish with pure water in it and the substrate on the hot plate, the inside of the sealed container was replaced with nitrogen and heating was performed at 80° C. Since the internal volume of the sealed container was 25 liters (0.025 $m^3$) and the amount of evaporated pure water was 0.5 g, the amount of water vapor inside the container was 20 g per cubic meter.

Next, an aluminum oxide film was formed on both surfaces of this substrate by a plasma CVD method. The film thicknesses were both set to about 10 nm.

After the above treatment, a silicon nitride film was formed on both surfaces using a plasma CVD apparatus. The film thicknesses were set to 90 nm on both the front and back.

Next, an Ag paste was printed on the base layer and the emitter layer respectively and dried. This was baked in an air atmosphere at 780° C.

Example 2

A back contact solar cell was fabricated in the same way as in Example 1 apart from setting the amount of pure water evaporated inside the sealed container to 1.0 g in the pre-treatment before the aluminum oxide films were formed. The amount of water vapor inside the container was 40 g per cubic meter.

Example 3

A back contact solar cell was fabricated in the same way as in Example 1 apart from setting the amount of pure water evaporated inside the sealed container to 2.0 g in the pre-treatment before the aluminum oxide films were formed. The amount of water vapor inside the container was 80 g per cubic meter.

Example 4

A back contact solar cell was fabricated in the same way as in Example 1 apart from setting the amount of pure water evaporated inside the sealed container to 6.5 g in the pre-treatment before the aluminum oxide films were formed. The amount of water vapor inside the container was 260 g per cubic meter.

Comparative Example 1

After performing in the same way as in Example 1 up to the surface glass removal, the rinsing, and the drying, without performing any pre-treatment in particular, the steps of forming the aluminum oxide film and thereafter were performed in the same way as in Example 1. Incidentally, the drying after the glass removal was performed by the method of passing indoor air through a filter, heating it to 80° C., and blowing it onto the substrate (same in Comparative Examples 2 to 3, Examples 1 to 4, and Examples 5 to 8). Room temperature is controlled to be about 25° C., and relative humidity to be about 50%, so the amount of water vapor per cubic meter at the time of drying is presumably about 11.5 g.

Example 5

A back contact solar cell was fabricated in the same way as in Example 1 apart from setting the heating temperature of the hot plate to 60° C. in the pre-treatment before the aluminum oxide films were formed.

Example 6

A back contact solar cell was fabricated in the same way as in Example 1 apart from setting the heating temperature of the hot plate to 100° C. in the pre-treatment before the aluminum oxide films were formed.

Comparative Example 2

A back contact solar cell was fabricated in the same way as in Example 1 apart from setting the heating temperature of the hot plate to 57° C. in the pre-treatment before the aluminum oxide films were formed.

Comparative Example 3

A back contact solar cell was fabricated in the same way as in Example 1 apart from setting the amount of water vapor per cubic meter to 17 g in the pre-treatment before the aluminum oxide films were formed.

Example 7

After performing in the same way as in Example 1 up to the surface glass removal, the rinsing, and the drying, without replacing the inside of the sealed container with nitrogen (that is, in air) heating was performed at 80° C. The amount of water vapor inside the container was set to 20 g per cubic meter. The steps of forming the aluminum oxide film and thereafter were performed in the same way as in Example 1.

Example 8

After performing in the same way as in Example 1 up to the surface glass removal and the rinsing, the substrate was put in a clean oven without drying, and was heated for 15 minutes at 80° C. Drying was performed without exhausting since the oven volume was large. Regarding the oven volume of 675 liters, it can be presumed from the fact that the 17 g of water adhered to the substrate and the substrate holder was completely dried that the amount of water inside the oven was 37 g per cubic meter. The steps of forming the aluminum oxide film and thereafter were performed in the same way as in Example 1.

Evaluation Method

Current-voltage characteristics of the thus obtained samples of the solar cell were measured by using a solar simulator manufactured by Yamashita Denso Corporation under conditions of an AM 1.5 spectrum, irradiation intensity of 100 mW/cm$^2$, and 25° C., and photoelectric conversion efficiency was obtained. The obtained results are shown in Table 1 below.

TABLE 1

| | Amount of water vapor (g/m$^3$) | Temperature (°C) | Short-circuit current (mA/cm$^2$) | Open circuit voltage (mV) | Fill factor (%) | Photoelectric conversion efficiency (%) |
|---|---|---|---|---|---|---|
| Example 1 | 20 | 80 | 40.9 | 669 | 81.5 | 22.3 |
| Example 2 | 40 | 80 | 41.1 | 672 | 81.1 | 22.4 |
| Example 3 | 80 | 80 | 41.1 | 672 | 81.5 | 22.5 |
| Example 4 | 260 | 80 | 41.0 | 670 | 81.2 | 22.3 |
| Example 5 | 20 | 60 | 40.8 | 668 | 81.5 | 22.2 |
| Example 6 | 20 | 100 | 41.0 | 672 | 81.3 | 22.4 |
| Comparative Example 1 | 11.5 | 80 | 40.5 | 660 | 80.8 | 21.6 |
| Example 7 | 20 | 80 | 41.0 | 671 | 81.4 | 22.4 |
| Example 8 | 37 | 80 | 41.2 | 670 | 81.5 | 22.5 |
| Comparative Example 2 | 20 | 57 | 40.7 | 663 | 80.8 | 21.8 |
| Comparative Example 3 | 17 | 80 | 40.6 | 662 | 80.7 | 21.7 |

Compared to the Comparative Examples, open circuit voltage is high and conversion efficiency is high in each of the Examples 1 to 4. This can be considered to be the effect of subjecting the substrate to heat treatment with the amount of water vapor around the substrate at 20 g/m$^3$ or more before the aluminum oxide film formation.

Compared to the Comparative Examples, open circuit voltage is high and conversion efficiency is high in each of the Examples 5 and 6. Conversion efficiency can be enhanced when the temperature of the substrate heating before the aluminum oxide film formation is 60 to 100° C.

Compared to the Comparative Examples, open circuit voltage is high and conversion efficiency is high in Example 7. Conversion efficiency can be enhanced when the inert gas at the time of the substrate heating before the aluminum oxide film formation is air as well.

Compared to the Comparative Examples, open circuit voltage is high and conversion efficiency is high in Example 8. The heat treatment of the substrate before the aluminum oxide film formation may also serve as the drying step.

It should be noted that the present invention is not limited to the above-described embodiments. The embodiments are just examples, and any examples that have substantially the same feature and demonstrate the same functions and effects as those in the technical concept disclosed in claims of the present invention are included in the technical scope of the present invention.

The invention claimed is:

1. A method for manufacturing a solar cell which includes steps of forming a p-n junction on a silicon semiconductor substrate and forming an aluminum oxide film on at least one main surface of the silicon semiconductor substrate, comprising:
    a step of subjecting the silicon semiconductor substrate to heat treatment in an atmosphere with 20 g or more water vapor per cubic meter and a temperature of 60° C. or more and 100° C. or less before the step of forming the aluminum oxide film.

2. The method for manufacturing a solar cell according to claim 1, wherein the atmosphere in the step of subjecting the silicon semiconductor substrate to heat treatment comprises air.

3. The method for manufacturing a solar cell according to claim 2, comprising a step of cleaning the silicon semiconductor substrate before the step of forming the aluminum oxide film, wherein
    the step of subjecting the silicon semiconductor substrate to heat treatment is performed at the same time as a drying step after the step of cleaning the silicon semiconductor substrate.

4. The method for manufacturing a solar cell according to claim 1, comprising a step of cleaning the silicon semiconductor substrate before the step of forming the aluminum oxide film, wherein
    the step of subjecting the silicon semiconductor substrate to heat treatment is performed at the same time as a drying step after the step of cleaning the silicon semiconductor substrate.

* * * * *